United States Patent [19]

Yamamoto et al.

[11] Patent Number: 4,889,229

[45] Date of Patent: * Dec. 26, 1989

[54] CASSETTE FOR STORING A PLURALITY OF ELECTRONIC COMPONENT CHIPS

[75] Inventors: Shinya Yamamoto; Koichi Saito, both of Nagaokakyo, Japan

[73] Assignee: Murata Manufacturing Co., Ltd., Japan

[*] Notice: The portion of the term of this patent subsequent to Jul. 11, 2006 has been disclaimed.

[21] Appl. No.: 184,112

[22] Filed: Apr. 20, 1988

[30] Foreign Application Priority Data

Apr. 20, 1987 [JP] Japan .................................. 62-96925

[51] Int. Cl.[4] ........................ B65D 73/02; B65D 43/20
[52] U.S. Cl. ..................................... 206/328; 29/740; 29/809; 220/350; 221/285; 221/306
[58] Field of Search .................................. 29/739-741, 29/809; 414/125, 126; 221/154, 174, 186, 197, 285, 288, 303, 306; 206/328, 329, 334; 220/345, 350

[56] References Cited

U.S. PATENT DOCUMENTS

| | | | |
|---|---|---|---|
| 2,650,699 | 9/1953 | Donovan | 220/350 X |
| 2,722,309 | 11/1955 | Waterman | 220/345 X |
| 3,524,541 | 8/1970 | Nelson | 220/345 X |
| 3,815,734 | 6/1974 | Kruckel | 220/350 X |
| 4,298,120 | 11/1981 | Kaneko et al. | 206/329 |
| 4,359,157 | 11/1982 | Horstman | 206/328 |
| 4,627,532 | 12/1986 | Clemens | 220/350 X |

FOREIGN PATENT DOCUMENTS 0193255 9/1986 European Pat. Off. .............. 29/741

Primary Examiner—Bryan P. Gehman
Attorney, Agent, or Firm—Ostrolenk, Faber, Gerb & Soffen

[57] ABSTRACT

A cassette for storing a plurality of electronic component chips employed for providing the plurality of electronic component chips to an apparatus for supplying electronic component chips comprises a plurality of electronic component chips; a case for storing the plurality of electronic component chips, which is provided with first and second outer wall surfaces adjacently intersecting with each other and an outlet formed in the first outer wall surface, the case also being for discharging the electronic component chips; and an openable closure for closing the outlet. The closure is formed by a flexible plate. The case has a guide portion for slidably guiding the closure over a portion along the first outer wall surface, and a portion along the second outer wall surface. The closure is guided by the guide portion to open and close the outlet, while one end portion thereof is positioned along the second outer wall surface whether the outlet is opened or closed. Such end portion of the closure is provided with a slidable opening/closing operation member, which is exposed on the second outer wall surface.

5 Claims, 10 Drawing Sheets

CASSETTE FOR STORING A PLURALITY OF ELECTRONIC COMPONENT CHIPS

BACKGROUND OF THE INVENTION

1. Field of the Invention

The present invention relates to a cassette storing a plurality of electronic component chips, which provides a form not only applicable to packaging and transportation of electronic component chips but also suitable for providing a large number of electronic component chips to an apparatus for supplying electronic component chips, such as a chip mounting apparatus for mounting the electronic component chips on printed circuit boards, etc.

The term "electronic component chip" herein used includes not only a "chip-like electronic component", being a finished product, but also a "chip-like electronic component body", being a partially fabricated item, which is to be connected with lead wires or the like in a later step.

2. Description of the Prior Art

Electronic component chips have been generally packaged by one of a taping system, a magazine system, a bagging system and the like, and the taping system currently forms the mainstream because of its high reliability of automation in mounting. Packing of electronic component chips by the taping system is disclosed in U.S. Pat. No. 4,298,120 entitled "Chip-like Electronic Component Series and Method for Supplying Chip-like Electronic Components" issued on Nov. 3, 1981 and granted to Kaneko, et al.

FIG. 20 shows exemplary packaging of electronic component chips by the taping system. This system comprises a tape member 2 rolled on a reel 1, for example, which tape member 2 is provided with a plurality of cavities distributed along its longitudinal direction to receive electronic component chips one by one in the cavities. In the taping system as shown in FIG. 20, the tape member 2 is in sandwich structure formed by a base tape 3 of cardboard, for example, and cover tapes 4 adhered to both surfaces thereof, as shown in section in a partially enlarged manner. The base tape 3 is provided with cavities 5, which are through-holes formed in the direction of thickness, to receive straight-sided electronic component chips 6, for example.

The aforementioned taping system can be directly applied to a chip mounting apparatus. Namely, one of the cover tapes 4 is stripped from the base tape 3 to open the cavities 5, thereby to discharge the electronic component chips 6. Such operation can be continuously performed while feeding the tape member 2 in the longitudinal direction.

In the magazine system, on the other hand, a plurality of electronic component chips, being in an aligned state, are received in a magazine. Such a magazine system is also directly applicable to a chip mounting apparatus.

In the bagging system, electronic component chips are simply packed in an appropriate bag, most inexpensively in the three types of packaging systems.

However, all of the aforementioned three types of packaging systems have problems to be solved.

In the taping system, submaterials other than the electronic component chips 6, such as the reel 1, the base tape 3 and the cover tapes 4 as shown in FIG. 20, are at a high cost. Further, the transportation cost per electronic component chip is increased due to the high cost relating to the submaterials. Further, the electronic component chips 6 are generally received one by one in the cavities 5, whereby a considerably long time is required to completely charge a prescribed number of electronic component chips 6. In addition, equipment for taping the electronic component chips 6 requires a relatively complicated mechanism, whereby the equipment cost is increased. In a chip mounting step on a consumer side, further, a plurality of reels 1 are generally transversely arranged to process the tape members 2 drawn out from the reels 1 on the same plane, whereby an occupied floor space of chip mounting equipment is inevitably increased. Since the number of the electronic component chips 6 held in the tape member 2 rolled on a single reel 1 is limited, the reel 1 must be replaced by a new one when all of the electronic component chips 6 are discharged. The chip mounting apparatus must be temporarily stopped in this case. When the chip mounting apparatus is operated with a plurality of reels 1, the entire apparatus must be stopped even if the electronic component chips 6 are completely discharged merely in a single reel 1. Further, if the reels 1 carry different numbers of electronic component chips 6, the electronic component chips 6 are separately used up in the respective reels 1. Thus, the operation rate of the chip mounting apparatus is lowered by such factors.

On the other hand, in comparison with the taping system, the magazine system substantially requires no large occupied floor space in chip mounting equipment and the transportation cost thereof is relatively low, whereas the cost is increased by submaterials such as the magazine and a stopper for retaining the electronic component chips in the magazine in transportation as well as equipment for magazinization similarly to the taping system, while a long time is required for such magazinization. Further, the critical defect of the magazine system as compared with the other systems is that the number of electronic component chips receivable in a single magazine is small. Thus, rotably caused in this system is the problem of lowering the operation rate of the chip mounting apparatus, as hereinabove described with reference to the taping system.

In the bagging system, equipment required for packaging is at a low cost and the packaging time can be reduced. However, although submaterials required for simply bagging a prescribed number of electronic component chips are at a low cost, some means must be adopted in transportation, in order to prevent breakage of the electronic component chips etc. In general, bags each containing a plurality of electronic component chips are packed in a small box, and a plurality of such small boxes are packed in a box of medium size. Then, a plurality of such medium-sized boxes are finally packed in a large box for shipment. Thus, in view of packaging through such stages, the bagging system is not necessarily at a low cost. Further, a parts feeder must be employed in the chip mounting step, and a plurality of such parts feeders require a large floor space. In particular, there is an idea of arranging storage vessels or hoppers employed in the above parts feeder in closer contact with each other, thereby to reduce the occupied floor space. In this case, however, the number of electronic component chips stored in a single storage vessel or hopper must inevitably be reduced, and hence new electronic component chips must be frequently fed to the storage vessel or hopper. Further, in order to closely arrange a number of storage vessels or hoppers in a narrow floor space, openings of the storage vessels or hoppers must be made small narrowed as a matter of course, whereby it is difficult to supply prescribed electronic component chips to prescribed ones of the storage vessels or hoppers from the exterior. Different types of electronic component chips may be erroneously dropped in adjacent storage vessels or hoppers.

In recent years, electronic component chips are so extremely reduced in size that it may be difficult to apply the taping system or the magazine system to such miniature electronic component chips, setting aside the bagging system.

SUMMARY OF THE INVENTION

Accordingly, an object of the present invention is t provide a novel mode of packaging electronic component chips, which can solve the aforementioned problems of the conventional packaging systems.

In order to solve the aforementioned problems, the present invention provides a cassette for storing electronic component chips, which is in the following structure:

The cassette storing electronic component chips according to the present invention is adapted to provide a plurality of electronic component chips to an apparatus for supplying electronic component chips. Such apparatus for supplying electronic component chips is a chip mounting apparatus, for example, or may be the aforementioned equipment for taping or magazinization.

Such a cassette for storing electronic component chips comprises:

case means provided with an internal space for storing a plurality of electronic component chips, first and second outer wall surfaces adjacently intersecting with each other and an outlet formed on the first outer wall surface to communicate with the internal space and for discharging the electronic component chips, and openable closure means for closing the outlet. The closure means is formed by a flexible plate and the case has a guide portion for slidably guiding the closure means over a portion along the first outer wall surface and a portion along the second outer wall surface. The closure is guided by the guide portion to close and open the outlet while one end portion thereof is positioned along the second outer wall surface whether the outlet is opened or closed. This end portion of the closure means is provided with slidable opening/closing operation means, which is exposed on the second outer wall surface.

The inventive cassette for storing electronic component chips is suitable as a packaging form for shipment of electronic component chips by an electronic component manufacturer. A large number of electronic component chips can be efficiently simultaneously charged in the internal space of the case, similarly to the bagging system. The electronic component chips can be stored in the internal space of the case in random conditions, and hence it is not necessary to direct the electronic component chips in a prescribed direction for the charging operation as in the taping and magazine systems or to charge the same one by one, while high-priced equipment is unnecessary for such operation. Further, since the electronic component chips can be brought into contact with each other in the internal space, a number of electronic component chips can be stored in a single case. Thus, the packaging cost per chip is considerably reduced as compared with the taping and magazine systems. In addition, the inventive cassette for storing electronic component chips is in such a constant form that at least the smallest box, being required for transportation in the conventional bagging system, is unnecessary, whereby a shippable form can be easily attained as compared with the bagging system. The transportation cost relating to submaterials other than the electronic component chips can be reduced according to the present invention as compared with the cost relating to submaterials required in the taping system or magazine system, as a matter of course.

Further, the cassette storing electronic component chips according to the present invention is particularly useful for storing miniature electronic component chips, handling of which is troublesome, since the electronic component chips may be randomly stored in the case.

On the other hand, the consumer of the electronic component chips stored in the inventive cassette can directly fix the cassette to a chip mounting apparatus to feed a plurality of electronic component chips to a chip mounting step. Namely, when the outlet of the case is directed to an opening of a hopper provided in the chip mounting apparatus, for example, to fix the case to the hopper and the closure means thereof is appropriately opened, the plurality of electronic component chips stored in the internal space of the case can be introduced into the hopper from the outlet. Handling of such a cassette is easy since its case has a constant form dissimilarly to the conventional bag. Even if new electronic component chips must be frequently supplied to the hopper, such operation can be efficiently performed by the excellent handling property of the cassette. Further, even if a plurality of hoppers having relatively small openings are closely provided in a narrow space, no electronic component chips will be erroneously dropped in adjacent hoppers. The inventive cassette fixed to the hopper of a chip mounting apparatus can be easily replaced by a new one because of the aforementioned excellent handling property. Thus, a suitable number of electronic component chips are always stored in the hopper of the chip mounting apparatus, to enable continuous operation of the chip mounting apparatus.

As compared with the conventional parts feeder, all of the electronic component chips stored in the cassette can be discharged from the outlet, thereby to completely use up the electronic component chips.

Since the case of the inventive cassette can be equalized in size to the hopper, there is no need to widen intervals between hoppers in order to assemble such cassettes into the hoppers. Thus, even if the chip mounting apparatus has a number of hoppers provided in a narrow occupied space, the cassette according to the present invention can be applied without any problem.

While a constant type of electronic component chips stored in a single cassette must be aligned in a constant direction in advance to a final mounting stage, such alignment may essentially be performed by the chip mounting apparatus.

The case of the inventive cassette is also adapted to protect the electronic component chips stored in the internal space of the same against mechanical shocks and environment. Further, this case has a constant form dissimilarly to the bagging system. Thus, the cassette provides a form suitable for storing the electronic component chips both for manufacturers and consumers of electronic components.

The aforementioned effect in the chip mounting apparatus can also be attained when the inventive cassette is applied to a step other than the chip mounting step such as a taping step of the electronic component chips 6 as shown in FIG. 20.

According to the present invention, the closure will not be lost since the same is slidingly opened/closed while being continuously held in the case during such opening/closing process. Thus, there is no need to make up for a lost closure in order to reuse the case.

In addition, the outlet for discharging the electronic component chips is formed on the first outer wall surface of the case, while the opening/closing operation means for opening/closing the closure is provided on the second outer wall surface which is adjacent to the first outer wall surface. Therefore, the opening/closing operation means can be operated without trouble when the cassette is mounted on an apparatus for supplying the electronic component chips with the outlet being directed to the apparatus. Thus, the closure can be opened after the cassette is mounted on the apparatus for supplying the electronic component chips, thereby to prevent the electronic component chips from being erroneously discharged in the exterior of the apparatus. On the other hand, the closure can be closed during when the cassette is mounted on the apparatus for supplying the electronic component chips. Thus, even if some of the electronic component chips are left in the case, the cassette can be demounted from the apparatus for supplying the electronic component chips while effectively holding the electronic component chips, by closing the closure. Further, the opening/closing operation means can be arbitrarily directed to permit visual recognition as to whether the closure is opened or closed after the cassette is mounted on the apparatus for supplying the electronic component chips.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
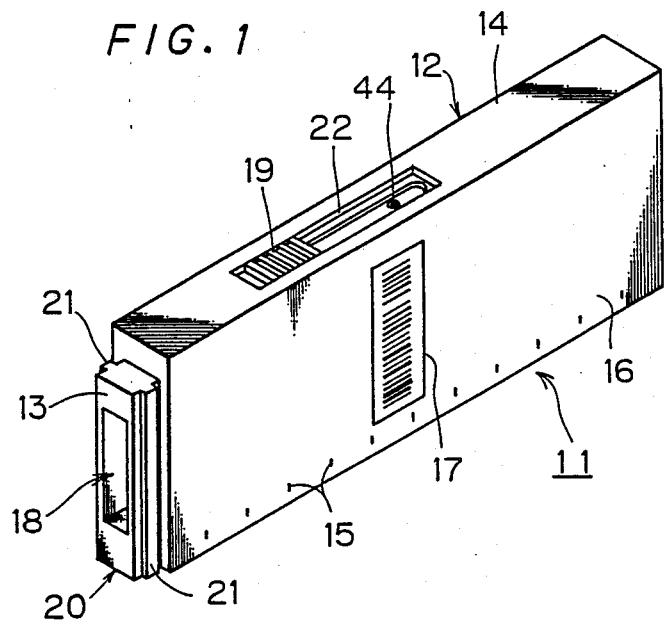
FIG. 1 is a perspective view showing appearance of a cassette 11 for storing electronic component chips according to an embodiment of the present invention.

FIG. 1 is a perspective view showing a cassette 11 storing electronic component chips according to an embodiment of the present invention.

This cassette 11 comprises a case 12, which is in the form of a rectangular parallelopiped as a whole. The case 12 has first and second outer wall surfaces 13 and 14, which adjacently intersect with each other. So long as such first and second outer wall surfaces 13 and 14 are provided, the case 12 may be prepared in any form. This case 12 is formed by a member of resin such as acrylic resin, acrylonitrile-butadien-styrene resin, styrene resin or polycarbonate, or paper. In order to manufacture a large number of such cases 12 by a resin material, a pair of two-piece type halves, having configurations corresponding to those cut along the line VII—VII in FIG. 2, may be separately formed for each case 12, to be connected with each other by screwing, adhesion or welding, for example. The case 12 may be entirely or partially transparent so that a plurality of electronic component chips stored in an internal space of the case 12 can be recognized from the exterior, although such structure is not shown in FIG. 1. Particularly when the case 12 is at least partially transparent, graduations 15 may be provided as schematically shown in FIG. 1, so that the quantity of remaining electronic component chips can be recognized in relation to the graduations 15. The case 12 is preferably antistatically processed in order to prevent static electricity caused by friction between the electronic component chips themselves or between the electronic component chips and the case 12.

A label 17 is attached on the widest third outer wall surface 16 of the case 12 as readable indication means. The label 17 indicates information as to the type, quantity etc. of the electronic component chips stored in the case 12 by optically or magnetically readable means such as bar codes. The cassette 11 is moved vertically in FIG. 1 to be mounted on a chip mounting apparatus, for example, while a direction for attaching the label 17 is so selected that the information indicated thereon can be read by scanning the label 17 along the direction of such movement.

As shown in FIG. 1, an outlet 18 is further provided on the first outer wall surface 13 of the case 12 for discharging the electronic component chips. This outlet 18 communicates with the internal space of the case 12, as hereinafter described. An opening/closing operation member 19 is slidably provided to be exposed on the second outer wall surface 14, in order to open/close an openable closure for closing the outlet 18. A mounting part 20 is provided in the vicinity of the first outer wall surface 13 of the case 12, in order to detachably mount the case 12 on an apparatus for supplying electronic component chips with the outlet 18 being directed to such an apparatus. This mounting part 20 has a pair of projecting ribs 21 extending along the vertical direction in FIG. 1.

FIGS. 2 to 6 illustrate the cassette 11, particularly the case 12 in various directions. Referring to FIGS. 2 to 6, further description is made on the structure of the case 12 as viewed from the exterior.

Figure 6:
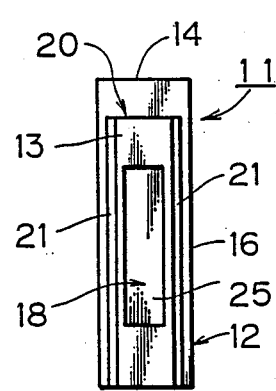
FIG. 6 is a left side elevational view of the cassette 11 as shown in FIG. 1.
Figure 5:
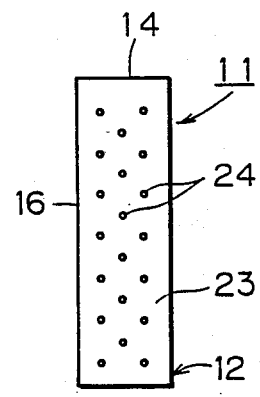
FIG. 5 is a right side elevational view of the cassette 11 as shown in FIG. 1.
Figure 2:
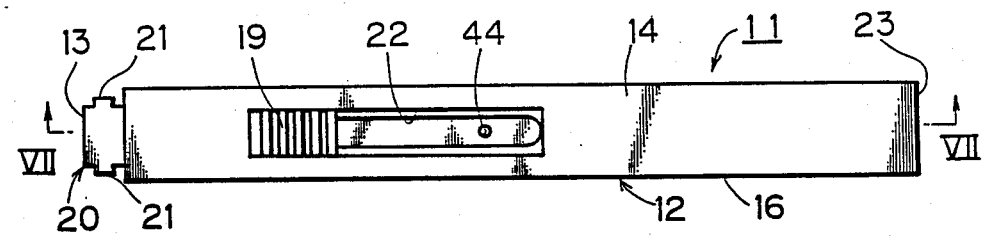
FIG. 2 is a plan view of the cassette 11 as shown in FIG. 1.
Figure 3:
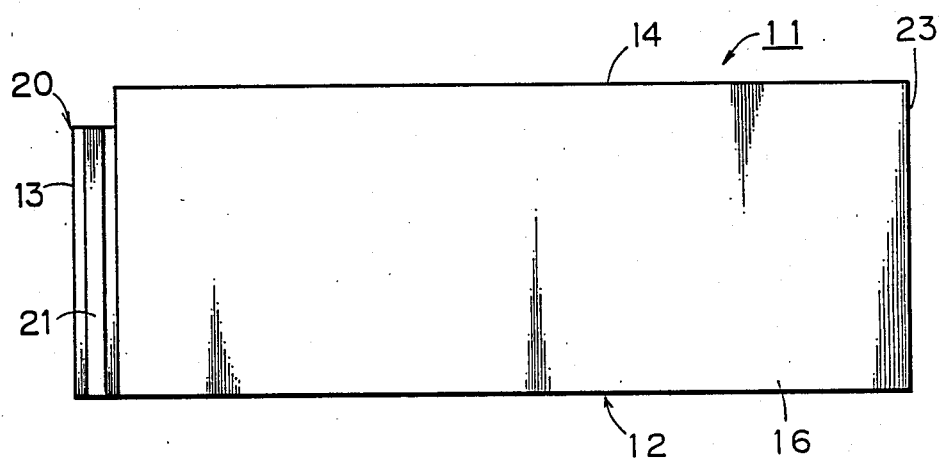
FIG. 3 is a front elevational view of the cassette 11 as shown in FIG. 1.

The opening/closing operation member 19, being exposed on the second outer wall surface 14 of the case 12 as shown in FIG. 2, does not project from the second outer wall surface 14, as obvious from FIGS. 3, 5 and 6. Thus, the opening/closing operation member 19 is advantageously prevented from inattentive manipulation in handling of the cassette 11 storing electronic component chips. This opening/closing operation member 19 is slidable within a range of a longitudinal cavity 22 provided in the second outer wall surface 14.

As shown in FIG. 5, a plurality of air vent holes 24 are provided on a fourth outer wall surface 23 of the case 12, which is opposite to the first outer wall surface 13. The size of such air vent holes 24 is so selected that the electronic component chips stored in the case 12 are not dropped through the same. The function of the air vent holes 24 is hereinafter described.

Referring to FIG. 6, a part of a closure 25 is seen from the outlet 18. This closure 25 is formed by a metal thin plate of stainless steel or phosphor bronze, for example, having thickness of about 0.05 to 0.15 mm. The closure 25 may alternatively be formed by a plate of a flexible material such as resin.

Figure 4:
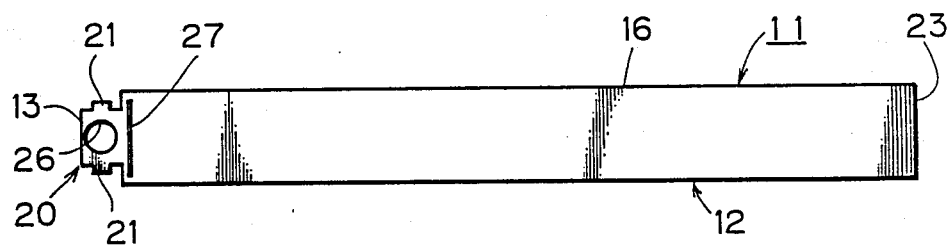
FIG. 4 is a bottom plan view of the cassette 11 as shown in FIG. 1.

As shown in FIG. 4, a hole 26 having a circular section, for example, is provided in the lower surface of the mounting part 20. The function of this hole 26 is hereinafter described. Further, a slit 27 is provided in the lower surface of the case 12, to partially form a guide portion for slidably guiding the closure 25. The slit 27 may not reach the lower surface of the case 12 as shown in FIG. 4.

Figure 7:
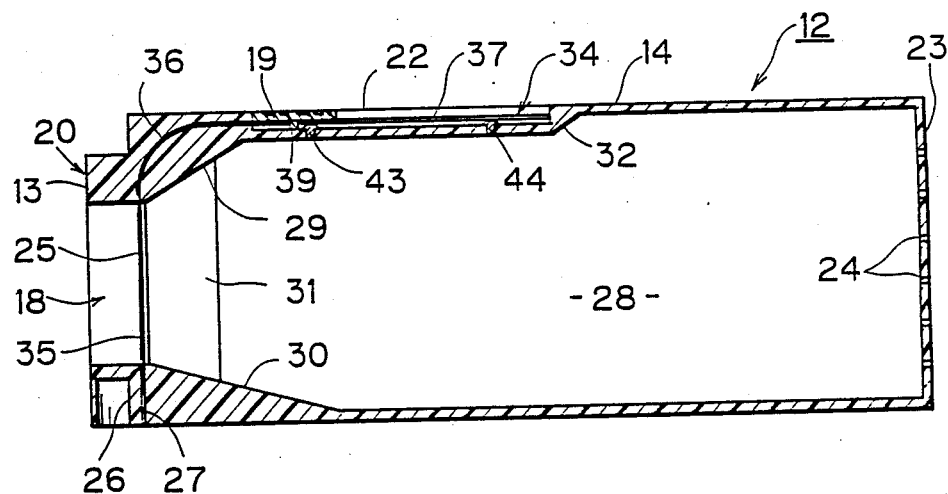
FIG. 7 is a sectional view of a case 12 taken along the line VII—VII in FIG. 2.
Figure 8:
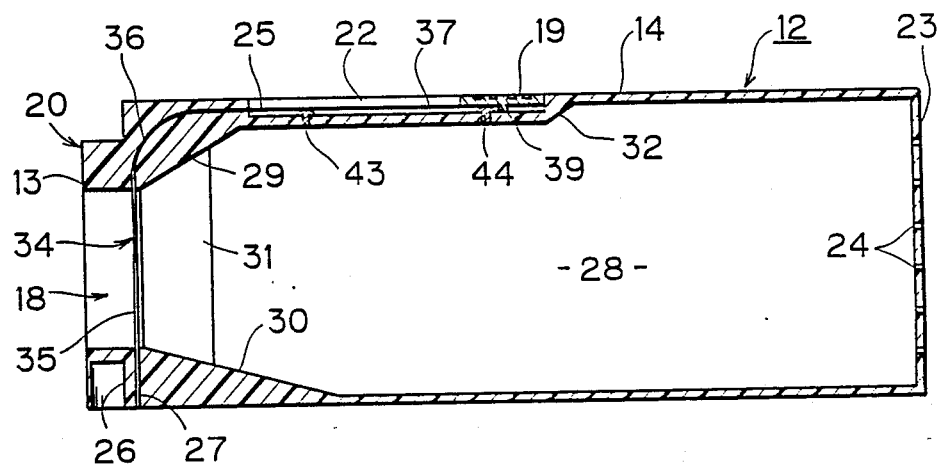
FIG. 8 is a sectional view similar to FIG. 7, showing a closure 25 being in an opened state.

FIG. 7 is a sectional view of the case 12 taken along the line VII—VII in FIG. 2. FIG. 8 is a sectional view similar to FIG. 7, showing the closure 25 being in an opened state. The plurality of electronic component chips stored in the case 12 are omitted in FIGS. 7 and 8.

Figure 13:
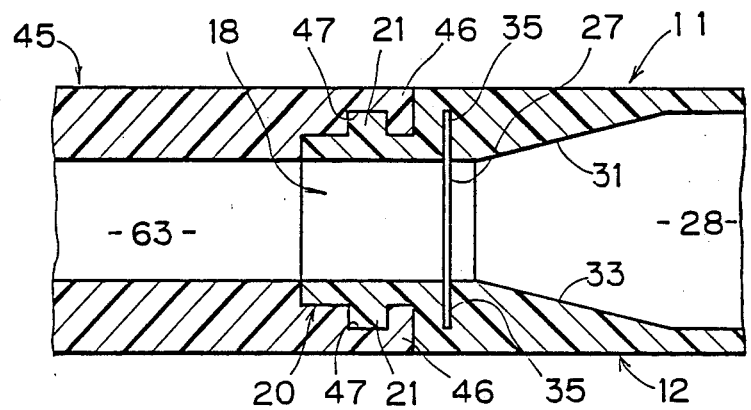
FIG. 13 is an enlarged sectional view taken along the line XIII—XIII in FIG. 12.

Referring to FIGS. 7 and 8, an internal space 28 for storing the electronic component chips is defined in the case 12. This internal space 28 communicates with the outlet 18. Various slopes 29 to 32 or the like are formed on wall surfaces defining the internal space 28 so that all of the electronic component chips smoothly flow toward the outlet 18 when the outlet 18 is relatively downwardly directed to discharge the electronic component chips stored in the internal space 28 by natural gravitational force from the outlet 18. FIG. 13 clearly shows the slope 31 thus formed, with another slope 33 being formed oppositely to the slope 31.

As understood from FIGS. 7 and 8 being comparable with each other, the closure 25 opens and closes the outlet 18, while one end portion thereof is positioned along the second outer wall surface 14 whether the outlet 18 is opened or closed. In order to guide such sliding operation of the closure 25, a guide portion 34 is formed over the first and second outer wall surfaces 13 and 14 of the case 12. The aforementioned slit 27 partially defines the guide portion 34, which is formed by a pair of grooves 35 (see FIG. 13) linearly extending from the slits 27 on opposite side walls defining the outlet 18 and by a slit 36 extending in the form of a partially cylindrical peripheral surface in the vicinity of the boundary between the first and second outer wall surfaces 13 and 14, as well as by a pair of grooves 37 (see FIG. 10) in a portion along the second outer wall surface 14.

Figure 9:
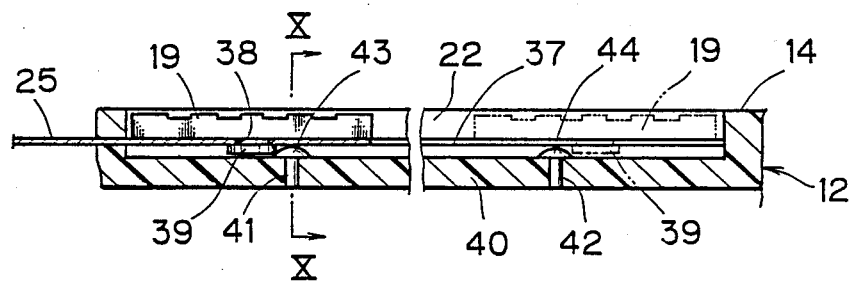
FIG. 9 is an enlarged sectional view showing the structure around a cavity 22 as shown in FIG. 7.
Figure 10:
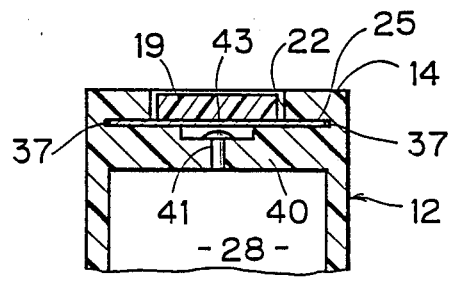
FIG. 10 is a sectional view taken along the line X—X in FIG. 9.

FIG. 9 shows the structure around the cavity 22 as shown in FIG. 7, in an enlarged manner. FIG. 10 is a sectional view taken along the line X—X in FIG. 9.

As hereinabove described, the end portion of the closure 25 is positioned along the second outer wall surface 14 whether the closure 25 closes or opens the outlet 18. According to this embodiment, the end portion of the closure 25 is designed to be always positioned in the cavity 22. A mounting hole 38 is provided in such an end portion of the closure 25, so that the aforementioned opening/closing operation member 19 is mounted on the closure 25 through the mounting hole 38. A projection 39 is provided on the lower surface of the opening/closing operation member 19 to be press-fitted or inserted in the mounting hole 38. Then the forward end portion of the projection 39 is caulked to mechanically fix the opening/closing operation member 19 to the closure 25. The projection 39 is preferably selected to extend from the lower surface of the closure 25.

The cavity 22 is provided on its bottom surface wall 40 with holes 41 and 42, into which round-head rivets 43 and 44 are press-fitted respectively. The head portions of the round-head rivets 43 and 44 serve as means for braking the sliding operation of the closure 25 at respective terminating ends of such sliding operation. Referring to FIG. 9, the closure 25 is closed when the opening/closing operation member 19 is in the position shown by solid lines, while the projection 39 goes beyond the head portion of the round-head rivet 43 to maintain such a state. On the other hand, the closure 25 is opened when the opening/closing operation member 19 is in the position shown by phantom lines in FIG. 9. The projection 39 goes beyond the round-head rivet 44 to maintain this state. The projection 39 thus goes beyond either the head portion of the round-head rivet 43 or 44 when the opening/closing operation member 19 is moved toward the position shown by the solid lines or the phantom lines in FIG. 9. Such operation is advantageously allowed by temporary deformation of the flexible closure 25.

By virtue of such means for braking the closure 25 at the respective terminating ends of its sliding operation, the closure 25 is effectively prevented from accidental opening in a closed state as well as from accidental closing in an opened state. In particular, the closure 25 is reliably prevented from sliding operation in an undesired direction caused by inevitable vibration in transportation of the cassette 11 storing electronic component chips or mounting on a chip mounting apparatus or the like.

Although the projection 39 is engaged with the head portions of the round-head rivets 43 and 44 in the aforementioned embodiment, configurations corresponding to such head portions of the round-head rivets 43 and 44 may be integrally formed on the bottom surface wall 40 of the cavity 22.

Further, small recesses, for example, may be provided in the bottom surface wall 40 of the cavity 22 to serve as the means for braking the closure 25 at the terminating ends of its sliding operation, so that the projection 39 is engaged in the small recesses, for example.

While the opening/closing operation member 19 is provided separately from the closure 25 in this embodiment, such an opening/closing operation member 19 may be replaced by an end portion of the closure 25, which is deformed to integrally serve as opening/closing operation means.

Figure 11:
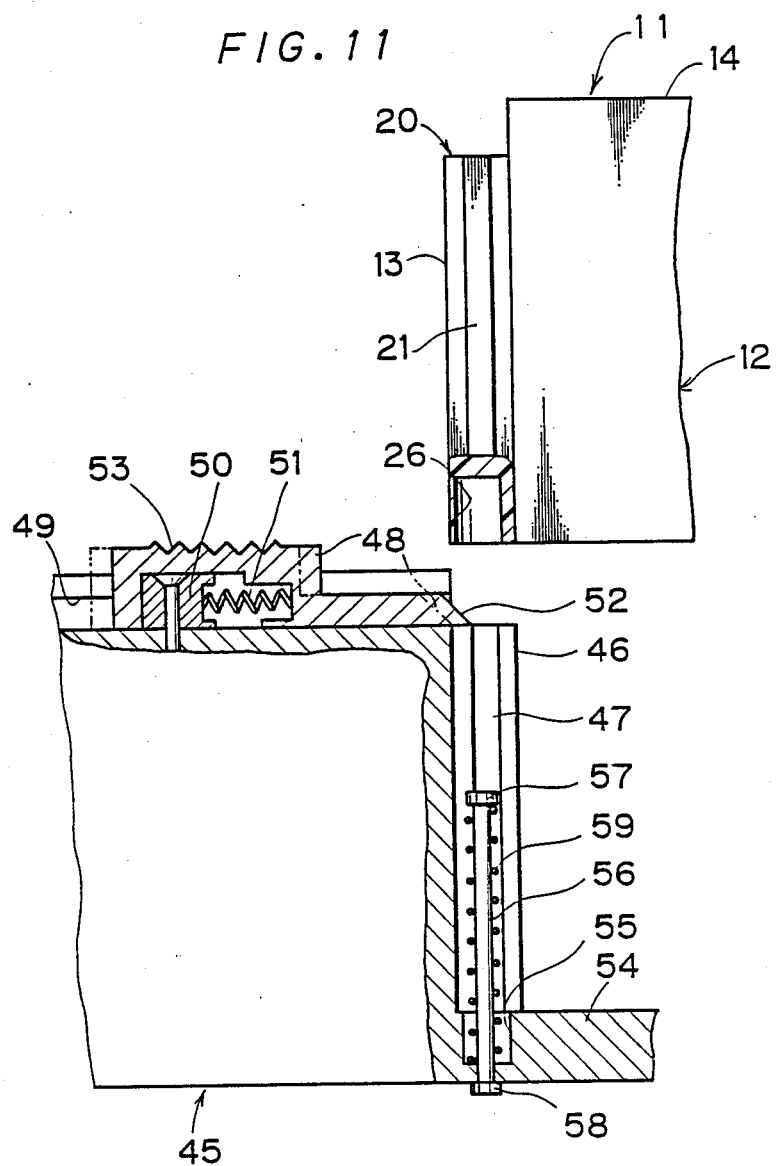
FIG. 11 is a partially fragmented front elevational view showing the cassette 11 for storing electronic component chips not yet mounted on a hopper 45 of a chip mounting apparatus.
Figure 12:
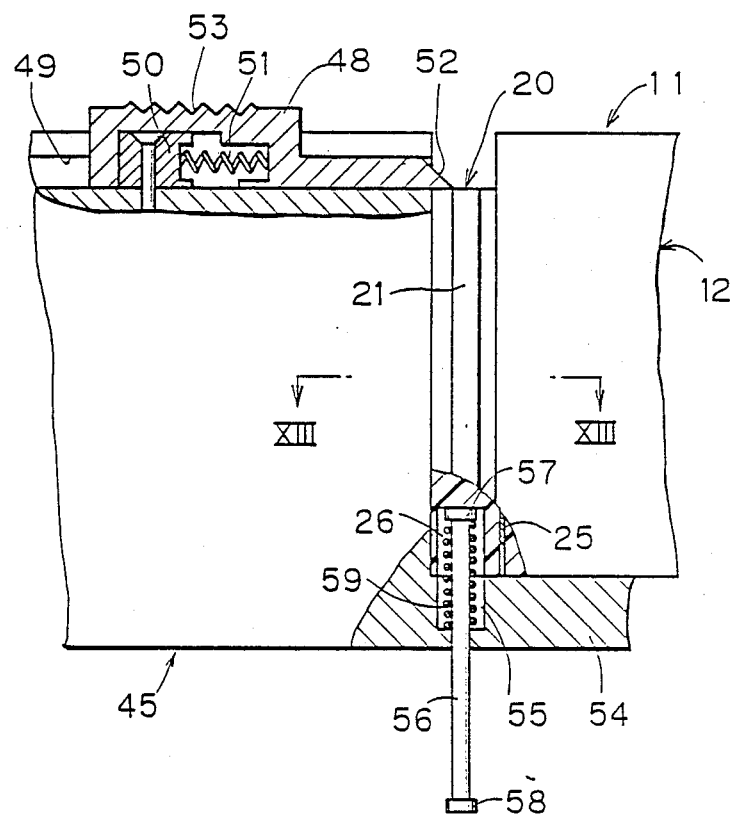
FIG. 12 is a partially fragmented front elevational view showing the cassette 11 mounted on the hopper 45.

With reference to FIGS. 11, 12 and 13, description is now made on a method of mounting the cassette 11 storing electronic component chips on a hopper 45 provided in a chip mounting apparatus, for example. FIG. 11 shows the cassette 11 not yet mounted on the hopper 45 and FIG. 12 shows the cassette 11 mounted on the hopper 45. FIG. 13 is an enlarged sectional view taken along the line XIII—XIII in FIG. 12.

The hopper 45 has structure for positioning and fixing the cassette 11 in relation to its mounting part 20. A pair of holding walls 46 are provided on the hopper 45 to receive the mounting part 20 between them. The pair of holding walls 46 are provided on inner surfaces thereof with grooves 47 for receiving the ribs 21 provided on the mounting part 20 respectively. Thus, the mounting part 20 is engaged into the hopper 45 by sliding movement along the first outer wall surface 13 of the case 12.

To attain such slidable engagement, the ribs 21 and the grooves 47 may be inverted in positional relation. In other words, grooves may be provided in the mounting part 20 and ribs may be provided on the holding walls 46.

The hopper 45 is provided with an engaging member 48, which is slidably held by a pair of guide grooves 49 (FIGS. 11 and 12 show only one of such guide grooves 49), to ensure such a mounting state of the cassette 11. A stopper 50 is fixed to the hopper 45 to define a terminating end of forward movement of the engaging member 48, while a compression spring 51 is provided between the stopper 50 and the engaging member 48. The compression spring 51 is adapted to forwardly urge the stopper 48 continuously. A sloped guide surface 52 is preferably formed on the forward end of the engaging member 48. Further, an indented operating surface 53 is formed on the upper surface of the engaging member 48, in order to facilitate manipulation etc. of the engaging member 48. A positioning wall 54 is provided between the pair of holding walls 46 of the hopper 45 to be in contact with the lower surface of the cassette 11 for positioning the same, while a cavity 55 is formed in the upper surface of the positioning wall 54. A vertically movable ejector pin 56 is provided through the bottom surface wall of the cavity 55. The ejector pin 56 has flanges 57 and 58 on both ends thereof. Further, a compression spring 59 is arranged to enclose the ejector pin 56. The compression spring 59 is adapted to exert elastic force between the upper flange 57 and the bottom surface wall of the cavity 55, whereby the ejector pin 56 is urged so that the lower flange 58 is brought into contact with the lower surface of the positioning wall 54 as shown in FIG. 11.

The cassette 11 is brought into the position as shown in FIG. 11, to be mounted on the hopper 45. In general, the cassette 11 is mounted on the hopper 45 by hand. The cassette 11 is directly downwardly moved in FIG. 11, so that the mounting part 20 is positioned between the pair of holding walls 46. In the course of such movement, the lower edge of the first outer wall surface 13 of the case 12 is brought into contact with the guide surface 52 on the forward end of the engaging member 48 to retract the engaging member 48 as shown by phantom lines in FIG. 11. Thus, there is no need to manipulate the engaging member 48 in order to mount the cassette 11. The mounting part 20 is held between the pair of holding walls 46 and the ribs 21 are engaged into the grooves 47, to allow downward sliding of the case 12. During such sliding movement, the upper end portion of the ejector pin 56 is fitted into the hole 26 provided in the lower surface of the case 12, so that the ejector pin 56 is downwardly displaced with the downward sliding movement of the case 12 against elasticity of the compression spring 59. When the case 12 is brought into contact with the positioning wall 54 to be in a prescribed mounting state as shown in FIG. 12, the upper end surface of the mounting part 20 is positioned lower than the engaging member 48, the forward end of which projects by elasticity of the compression spring 51 to be engaged with the upper end surface of the mounting part 20. Thus, the cassette 11 is securely retained in the hopper 45. In such a mounting state, the compression spring 59 upwardly displaces the ejector pin 56, to also prevent rattling of the cassette 11 in the mounting state.

The cassette 11 is demounted from the hopper 45 to be replaced by another cassette when the electronic component chips stored therein are completely discharged, for example. In this case, the engaging member 48 is first operated through the operating surface 53, for example, to retract the forward end of the engaging member 48 against elasticity of the compression spring 51. Simultaneously with such retraction of the forward end of the engaging member 48, the cassette 11 is lifted up through the ejector pin 56 by function of the compression spring 59. The cassette 11 is further lifted up to be completely separated from the hopper 45.

As hereinabove described, the compression spring 59 is adapted to lift up the cassette 11 through the ejector pin 56, for example, to attain the following advantage: When a large number of or various types of electronic component chips must be supplied in a chip mounting step, required are a large number of hoppers 45, which are preferably arranged as close as possible in order to minimize the occupied floor space. However, if such a large number of hoppers 45 are provided in close contact with each other, clearances between the cassettes 11 are extremely reduced. When the respective outer side surfaces of each hopper 45 and each cassette 11 are in the same plane as shown in FIG. 13, for example, substantially no clearance is defined between each pair of adjacent cassettes 11 if the hoppers 45 are thus provided in close contact with each other. In such case, only a cassette 11 to be extracted can be lifted up by the compression spring 59 through the ejector pin 56 beyond adjacent cassettes 11, to be easily picked up by hand, for example.

The guide surface 52 provided on the forward end of the engaging member 48 as shown in FIGS. 11 and 12 may be omitted. In this case, the engaging member 48 may be retracted through the operation on the operating surface 53 at least in the first stage of mounting the cassette 11.

Figure 14:
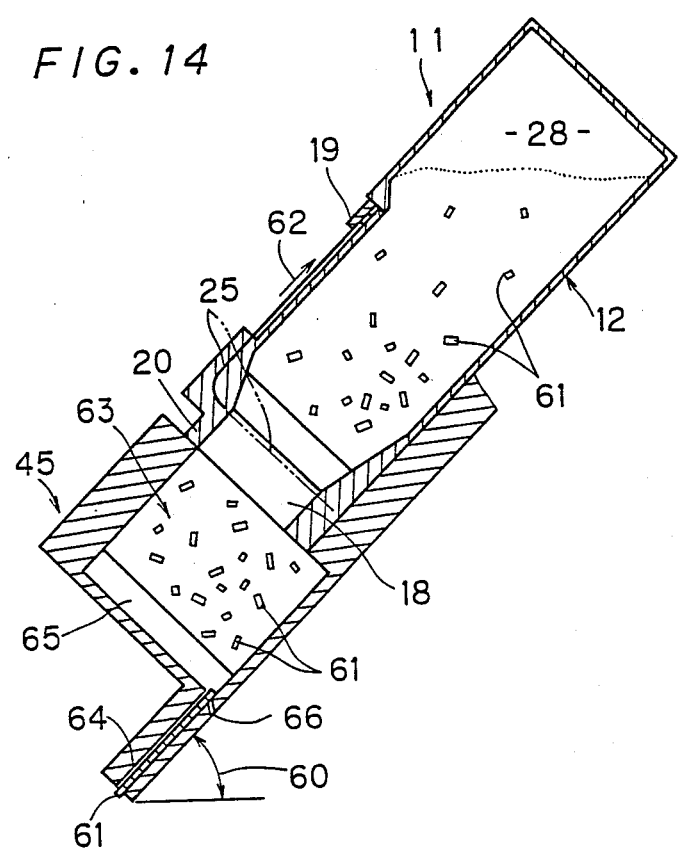
FIG. 14 is a sectional view schematically showing the cassette 11 storing electronic component chips mounted on the hopper 45.

After the cassette 11 is mounted on the hopper 45 as shown in FIG. 12, the electronic component chips stored in the case 12 are discharged into the hopper 45. FIG. 14 schematically shows this state.

As shown in FIG. 14, the hopper 45 is inclined at an angle 60 of about 45°, for example. Thus, the cassette 11 is also inclined with its outlet 18 being relatively downwardly directed. FIG. 14 schematically illustrates a plurality of electronic component chips 61. Although the electronic component chips 61 shown in the figure are straight-sided, for example, the present invention is also applicable to cylindrical or discoidal electronic component chips. Further, although FIG. 14 schematically shows several electronic component chips 61, a single case 12 can store about ten thousand electronic component chips 61, for example. It is pointed out that electrodes etc. formed on the electronic component chips 61 are not shown in FIG. 14.

After the cassette 11 is thus mounted on the hopper 45, the opening/closing operation member 19 is slidingly operated along arrow 62, thereby to open the closure 25. The electronic component chips 61 are responsively discharged from the outlet 18 to be temporarily stored in a storage space 63 defined in the hopper 45. An aligning passage 64 is provided in communication with the lower end portion of the storage space 63. This aligning passage 64 is adapted to align the electronic component chips 61 while turning the same to a prescribed direction. The sectional configuration of the aligning passage 64 is selected to accept only the minimum size and the intermediate or second minimum size of the straight-sided electronic component chips 61 within vertical, transverse and perpendicular ones thereof. Preferably an inclined surface 65 is formed in the boundary between the storage space 63 and the aligning passage 64, so that the electronic component chips 61 stored in the storage space 63 can be easily turned to a prescribed direction to be introduced into the aligning passage 64.

Figure 15:
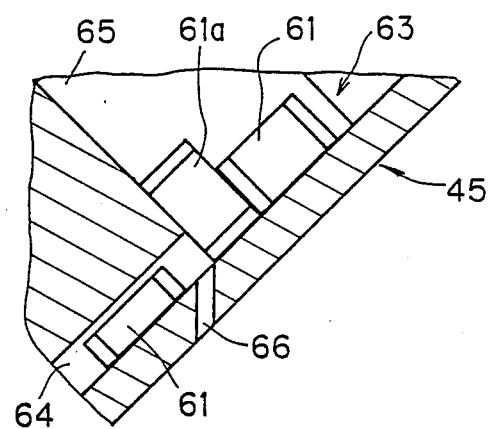
FIG. 15 is an enlarged sectional view for illustrating structure preferably employed for the hopper.

FIG. 15 shows structure around an inlet of the aligning passage 64 defined in the hopper 45, in an enlarged manner. As shown in FIG. 15, an electronic component chip 61a being close to the boundary between the storage space 63 and the aligning passage 64 tends to block the inlet of the aligning passage 64. In order to prevent this, a blowing passage 66 is preferably provided for blowing compressed air against the electronic component chip 61a. The blowing passage 66 is intermittently supplied with compressed air thereby to blow off an electronic component chip such as the electronic component chip 62a blowing the aligning passage 64, so that the electronic component chips 61 are smoothly transferred through the aligning passage 64.

The compressed air thus blown through the blowing passage 66 may temporarily increase pressures in the storage space 63 of the hopper 45 and the internal space 28 of the case 12, while the air vent holes 24 (see FIG. 5) are provided on the fourth outer wall surface 23 of the case 12 as hereinabove described, in order to avoid such increase in pressure. The air vent holes 24 are also adapted to facilitate smooth flow of air from the storage space 63 to the internal space 28, so that the electronic component chips 61 (FIG. 14), being stacked with each other, are stirred by such air flow. Air vent holes 24 may be provided in positions other than those shown in the figure.

Figure 16:
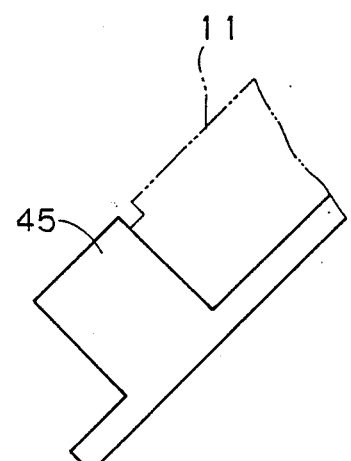
FIG. 16 schematically illustrates exemplary structure including the hopper 45 and a chip mounting station.
Figure 16:
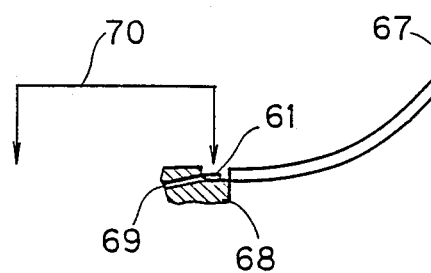

FIG. 16 shows exemplary structure of a part from the hopper 45 to a chip mounting station in the chip mounting apparatus.

A tube 67 for carrying the electronic component chips 61 is coupled to communicate with the aligning passage 64 (FIG. 14) provided in the hopper 45. Similarly to the aligning passage 64, the tube 67 forms a passage having a section analogous to a section defined by the minimum size and the intermediate size of the electronic component chips 61. An electronic component chip 61 to be discharged from the tube 67 has its minimum size being vertically directed.

A positioning stand 68 is provided adjacent to an outlet of the tube 67. The positioning stand 68 is provided with a vacuum passage 69 which is supplied with vacuum at prescribed time intervals to draw the electronic component chips 61 being discharged from the tube 67, thereby to position the same on the positioning stand 68. The electronic component chips 61 thus positioned on the positioning stand 68 are carried by a vacuum suction chuck (not shown) or the like in a direction 70, to be supplied onto appropriate circuit substrates.

Figure 17:
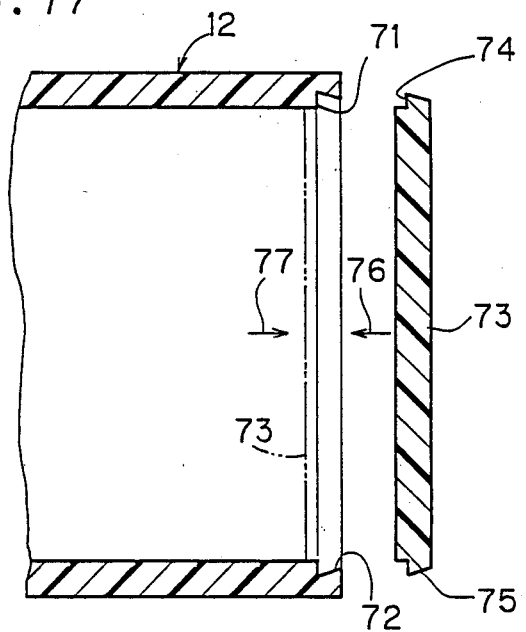
FIGS. 17 and 18 are enlarged sectional views respectively showing single ends of cases 12 for illustrating other embodiments of the present invention.
Figure 18:
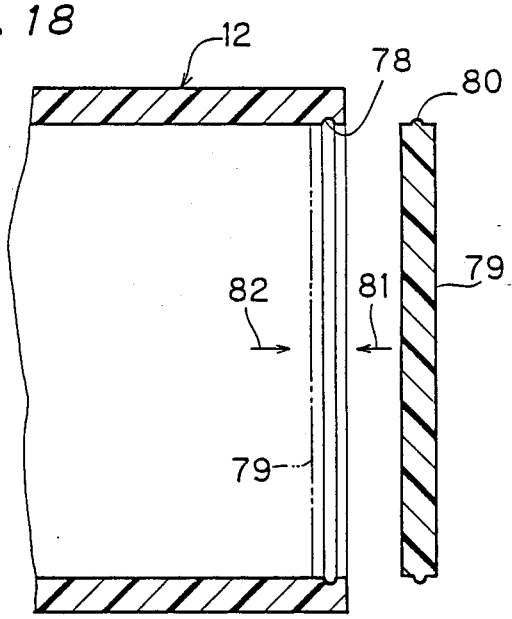

FIGS. 17 and 18 are enlarged sectional views for illustrating other embodiments of the present invention respectively. Each figure shows an end portion, being opposite to an outlet, of a case 12 forming a part of a cassette storing electronic component chips, for illustrating preferred structure for detachably mounting a wall portion, which serves as the fourth outer wall surface 23 as shown in FIG. 5 in the aforementioned embodiment.

Referring to FIG. 17, a stepped portion 71 is formed on a wall surface defining an opening formed on one end of the case 12, while an inwardly inclined tapered surface 72 extends from the peripheral edge of the stepped portion 71. On the other hand, a stepped portion 74 corresponding to the said stepped portion 71 and a tapered surface 75 corresponding to the said tapered surface 72 are formed in the periphery of a wall member 73 for serving as the fourth outer wall surface 23.

The wall member 73 is forcibly fitted into the opening of the case 12 along arrow 76. Thus, the wall member 73 closes the opening of the case 12 as shown by the phantom line, while the tapered surfaces 72 and 75 are brought into contact with each other to retain such a closed state. In order to remove the wall member 73 mounted to close the opening of the case 12 as shown by the phantom line, the wall member 73 may be forcibly moved along arrow 77.

Referring to FIG. 18, a circumferentially extending groove 78 is formed in an inner peripheral surface defining an opening of the case 12. On the other hand, a rib 80 corresponding to the groove 78 circumferentially extends in the periphery of a wall member 79 for closing the opening.

In order to fit the wall member 79 into the opening of the case 12, the wall member 79 may be forcibly pushed along arrow 81. Thus, the rib 80 is engaged into the groove 78 as shown by the phantom line, to fix the wall member 79 to the case 12. In order to remove the wall member 79 from the case 12, on the other hand, the wall member 79 may be forcibly extruded along arrow 82.

Through employment of the structure as shown in FIG. 17 or 18, the electronic component chips 61 can be further easily introduced into the internal space 28 when the case 12 is reused. However, if such an advantage is not desired, a member corresponding to the wall member 73 or 79 may be semipermanently fixed to the case 12 by an adhesive agent, for example, or integrally formed with the case 12. Further, the electronic component chips 61 may be introduced into the internal space 28 of the case 12 without employing the opening of the case as shown in FIG. 17 or 18, but through the outlet 18 with the closure 25 being in an opened state.

Figure 19:
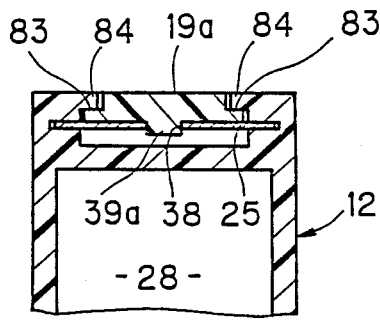
FIG. 19 is a sectional view corresponding to FIG. 10, for illustrating a further embodiment of the present invention.
Figure 20:
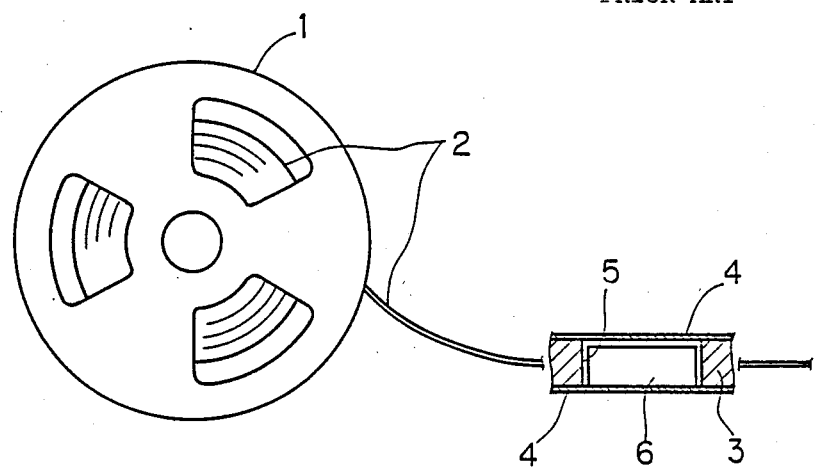
FIG. 20 illustrates a taping system as an exemplary conventional form of packaging electronic component chips.

FIG. 19 is a sectional view which is similar to FIG. 10, for illustrating a further embodiment of the present invention.

In the embodiment as shown in FIGS. 9 and 10, the opening/closing operation member 19 is held in the case 12 through the closure 25. In the embodiment as shown in FIG. 19, on the other hand, an opening/closing operation member 19a itself is held by a case 12. The opening/closing operation member 19a is provided with stepped portions 83, while the case 12 is provided with wall portions 84 for covering the stepped portions 83. Thus, the opening/closing operation member 19a is held between the wall portions 84 and a closure 25. A projection 39a is provided on the lower surface of the opening/closing operation member 19a, to be engaged with a mounting hole 38 of the closure 25. This projection 39a may be simply inserted in the mounting hole 38, since the opening/closing operation member 19a is held by the wall portions 34 with no mechanical fixing of the opening/closing operation member 19a to the closure 25.

Although the present invention has been described and illustrated in detail, it is clearly understood that the same is by way of illustration and example only and is not to be taken by way of limitation, the scope of the present invention being limited only by the terms of the appended claims.

What is claimed is:

1. A cassette for storing a plurality of electronic component chips and for providing said plurality of electronic component chips to an apparatus for supplying electronic component chips, said cassette comprising:

case means internally provided with a main, open storage space for storing a plurality of electronic component chips arrayed in random positions and orientations, first and second outer wall surfaces adjacently intersecting with each other and an outlet formed in said first outer wall surface to communicate with said storage space and for discharging said electronic component chips; and openable closure means closing said outlet, said closure means being formed by a flexible plate;

said case means being provided with a guide portion for slidably guiding said closure means over a portion along said first outer wall surface and a portion along said second outer wall surface, said closure means being guided by said guide portion to open and close said outlet with one end portion thereof being positioned along said second outer wall surface whether said outlet is opened or closed;

slidable opening/closing operation means for opening and closing said closure means being provided in said one end portion of said closure means to be exposed on said second outer wall surface;

a mounting part being provided in the vicinity of said first outer wall surface of said case means for detachably mounting said case means on an apparatus for supplying said electronic component chips with said outlet being directed to said apparatus.

2. A cassette for storing electronic component chips in accordance with claim 1, wherein said first outer wall surface has an elongated, generally rectangular shape, the direction of elongation of which defines a longitudinal direction and said mounting part has formations to be engaged with said apparatus by sliding movement of said case means along the longitudinal direction of said first outer wall surface.

3. A cassette for storing electronic component chips in accordance with claim 1, wherein said closure means is formed by a thin metal plate.

4. A cassette for storing electronic component chips in accordance with claim 1, wherein said opening/closing operation means comprises an opening/closing operation member (19, 19a) provided separately from said closure means.

5. A cassette for storing electronic component chips in accordance with claim 1, further including means (43, 44) for retarding sliding operation of said closure means at respective terminating ends of said sliding operation.

* * * * *